(12) United States Patent
Li et al.

(10) Patent No.: US 12,232,406 B2
(45) Date of Patent: Feb. 18, 2025

(54) METHOD OF MANUFACTURING OLED DISPLAY PANEL, DISPLAY PANEL AND DISPLAY DEVICE

(71) Applicants: Chongqing BOE Display Technology Co., Ltd., Chongqing (CN); BOE TECHNOLOGY GROUP CO., LTD., Beijing (CN)

(72) Inventors: Jie Li, Beijing (CN); Zuo Chen, Beijing (CN)

(73) Assignees: Chongqing BOE Display Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 494 days.

(21) Appl. No.: 17/771,903

(22) PCT Filed: Jun. 15, 2021

(86) PCT No.: PCT/CN2021/099930
§ 371 (c)(1),
(2) Date: Apr. 26, 2022

(87) PCT Pub. No.: WO2021/254297
PCT Pub. Date: Dec. 23, 2021

(65) Prior Publication Data
US 2022/0376218 A1 Nov. 24, 2022

(30) Foreign Application Priority Data
Jun. 15, 2020 (CN) .......................... 202010543462.3

(51) Int. Cl.
*H10K 71/00* (2023.01)
*H10K 50/86* (2023.01)

(52) U.S. Cl.
CPC ........... *H10K 71/00* (2023.02); *H10K 50/865* (2023.02)

(58) Field of Classification Search
CPC .. H10K 71/00; H10K 50/865; H10K 59/8792; H10K 59/873; H10K 59/38; H10K 71/231
See application file for complete search history.

(56) References Cited

U.S. PATENT DOCUMENTS

| 2004/0217681 A1 | 11/2004 | Park et al. |
| 2016/0155789 A1 | 6/2016 | Kim et al. |

(Continued)

FOREIGN PATENT DOCUMENTS

| CN | 1551699 A | 12/2004 |
| CN | 102749752 A | 10/2012 |

(Continued)

*Primary Examiner* — Moazzam Hossain
(74) *Attorney, Agent, or Firm* — The Webb Law Firm

(57) ABSTRACT

The present disclosure relates to a method of manufacturing an OLED display panel, a display panel and a display device. A method of manufacturing an OLED display panel, comprising: providing a backplane, wherein a light-emitting layer is provided on the backplane, and an encapsulation layer is provided on the light-emitting layer; forming an organic layer on a side of the encapsulation layer away from the light-emitting layer using an organic material; patterning the organic layer to form a first region covered by the organic layer and a second region not covered by the organic layer on the encapsulation layer; etching the organic layer in the first region to form a plurality of pits on a surface of the organic layer away from the encapsulation layer; filling the plurality of pits with a metal to form a black mask layer; forming a color film layer in the second region; and forming a planar layer covering the color film layer and the black mask layer.

14 Claims, 6 Drawing Sheets

(56) References Cited

U.S. PATENT DOCUMENTS

| | | | |
|---|---|---|---|
| 2020/0105854 A1 | 4/2020 | Kim et al. | |
| 2020/0286970 A1* | 9/2020 | Yu | H10K 71/00 |
| 2020/0365833 A1* | 11/2020 | Joo | H10K 59/873 |
| 2021/0335952 A1 | 10/2021 | Huang et al. | |
| 2023/0130238 A1* | 4/2023 | Zhang | H10K 59/873 |
| | | | 257/40 |
| 2023/0165049 A1* | 5/2023 | Du | H10K 59/873 |
| | | | 257/40 |

FOREIGN PATENT DOCUMENTS

| | | |
|---|---|---|
| CN | 109065754 A | 12/2018 |
| CN | 110350003 A | 10/2019 |
| CN | 111554731 A | 8/2020 |

* cited by examiner

… (1)

METHOD OF MANUFACTURING OLED DISPLAY PANEL, DISPLAY PANEL AND DISPLAY DEVICE

CROSS REFERENCE TO RELATED APPLICATIONS

This application is the national phase of International Application No. PCT/CN2021/099930, filed on Jun. 15, 2021, and claims priority to Chinese patent application no. 202010543462.2, filed on Jun. 15, 2020, the disclosures of which are hereby incorporated by reference in their entirety.

FIELD OF THE INVENTION

The present disclosure generally relates to the field of display technology, and in particular, to a method of manufacturing an OLED display panel, a display panel, and a display device.

BACKGROUND

COE (Color Film On Encapsulation, that is, color film directly applied to the encapsulation layer), as a new technology for replacing external polarizers, is a technique that directly integrates a filter function on a display backplane, which can significantly reduce the thickness of the display backplane, thereby saving a lot of production costs, and bringing huge production benefits to enterprises. However, due to the issues of the current COE production process itself, such as alignment, residue, peeling, etc., the product yield of COE projects is relatively low. Therefore, how to effectively address these issues encountered at present has become one of the main directions of COE research.

SUMMARY

According to an aspect of the present disclosure, a method of manufacturing an OLED display panel is provided, including:
  providing a backplane, wherein a light-emitting layer is provided on the backplane, and an encapsulation layer is provided on the light-emitting layer;
  forming an organic layer on a side of the encapsulation layer away from the light-emitting layer using an organic material;
  patterning the organic layer to form a first region covered by the organic layer and a second region not covered by the organic layer on the encapsulation layer;
  etching the organic layer in the first region to form a plurality of pits on a surface of the organic layer away from the encapsulation layer;
  filling the plurality of pits with a metal to form a black mask layer;
  forming a color film layer in the second region;
  and forming a planar layer covering the color film layer and the black mask layer.

In some embodiments according to the present disclosure, the material of the organic layer is an organic material whose main chain is a benzene ring molecular structure.

In some embodiments according to the present disclosure, the material of the organic layer is a modified phenolic resin.

In some embodiments according to the present disclosure, the etching is a dry etching process.

In some embodiments according to the present disclosure, a gas environment of the dry etching process is an oxygen environment.

In some embodiments according to the present disclosure, an oxygen flow rate of the dry etching is 90 sccm to 170 sccm.

In some embodiments according to the present disclosure, an oxygen flow rate of the dry etching is 150 sccm.

In some embodiments according to the present disclosure, the pressure of the oxygen environment is 10 mmHg to 30 mmHg.

In some embodiments according to the present disclosure, the temperature of the dry etching process is 70° C. to 90° C.

In some embodiments according to the present disclosure, the time of the dry etching is 10 s to 20 s.

In some embodiments according to the present disclosure, filling the plurality of pits with a metal to form a black mask layer includes:
  forming a metal layer on the side with the pits on the organic layer, etching the metal layer to only remain the metal in the pits.

In some embodiments according to the present disclosure, the metal is selected from one of: titanium/aluminum/titanium, aluminum, molybdenum, copper and silver.

In accordance with another aspect of the present disclosure, there is provided an OLED display panel prepared by using the above method according to the present disclosure.

According to yet another aspect of the present disclosure, there is provided an OLED display device, including the above OLED display panel according to the present disclosure.

BRIEF DESCRIPTION OF THE DRAWINGS

Other features, objects and advantages of the present application will become more clear by reading the detailed description of non-limiting embodiments made with reference to the following drawings.

DETAILED DESCRIPTIONS

Figure 1:
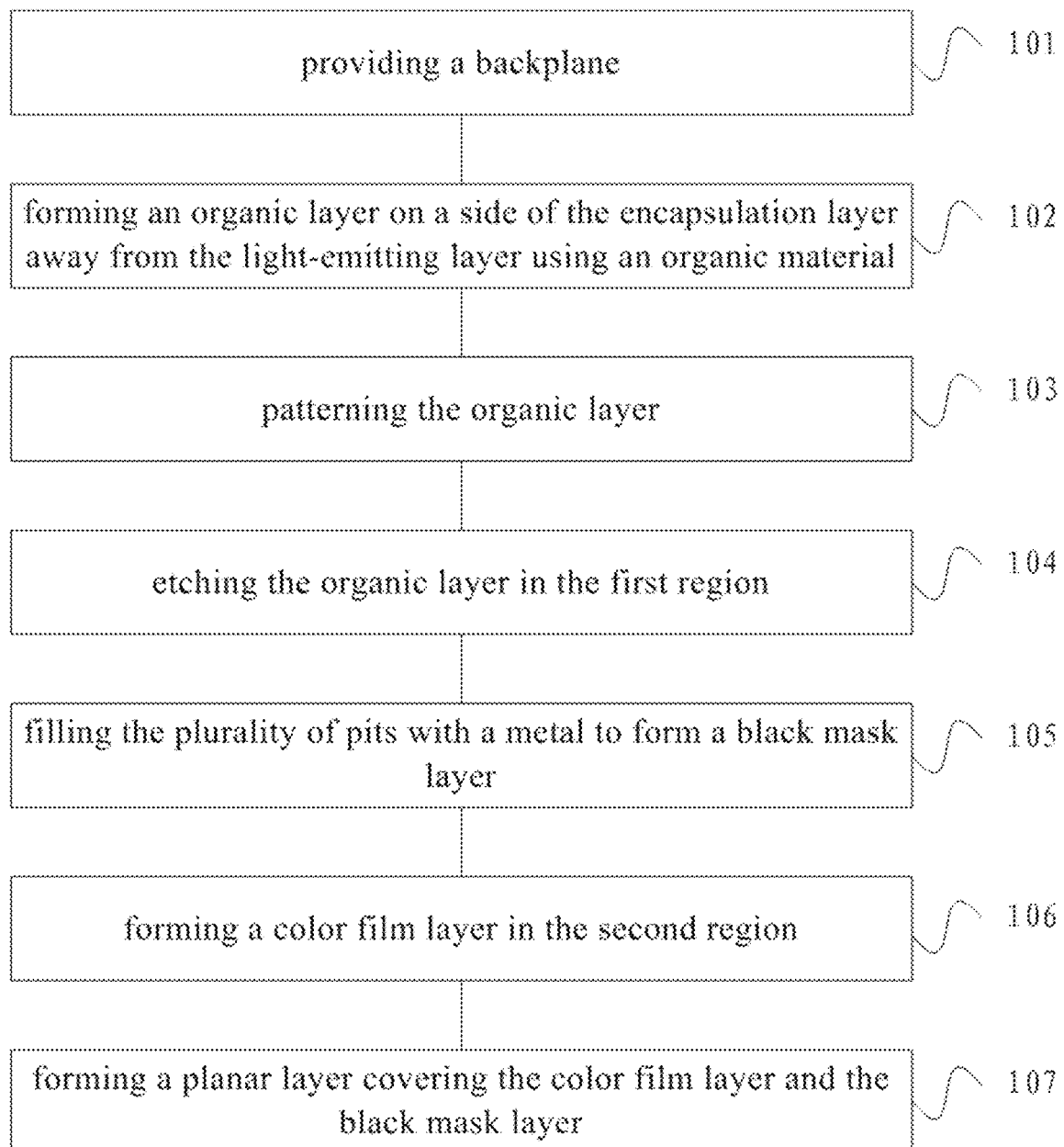
FIG. 1 is a flowchart of a method of manufacturing an OLED display panel according to an embodiment.

The present application will be further described in detail below with reference to the accompanying drawings and embodiments. It should be understood that the specific embodiments described herein are only used to explain the related invention, but not to limit the invention. In addition, it should be noted that, for the convenience of description, only the parts related to the invention are shown in the drawings.

It should be noted that, in the case of no conflict, the embodiments and the features of the embodiments of the present application may be combined with each other. Hereinafter, the present application will be described in detail with reference to the drawings and in conjunction with embodiments.

FIG. 1 shows a method of manufacturing an OLED display panel according to an embodiment of the present disclosure, which includes steps of:

providing a backplane, wherein a light-emitting layer is provided on the backplane, and an encapsulation layer is provided on the light-emitting layer (step 101);

forming an organic layer on a side of the encapsulation layer away from the light-emitting layer using an organic material (step 102);

patterning the organic layer to form a first region covered by the organic layer and a second region not covered by the organic layer on the encapsulation layer (step 103);

etching the organic layer in the first region to form a plurality of pits on a surface of the organic layer away from the encapsulation layer (step 104);

filling the plurality of pits with a metal to form a black mask layer (step 105);

forming a color film layer in the second region (step 106); and forming a planar layer covering the color film layer and the black mask layer (step 107).

Figure 2:
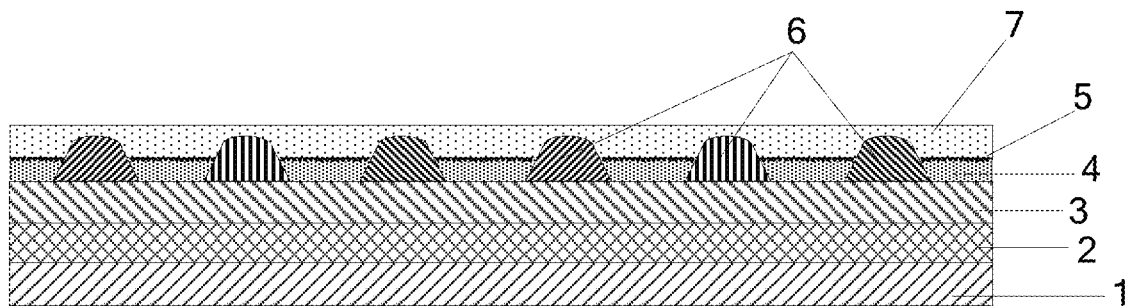
FIG. 2 is a schematic structural diagram of an OLED display panel according to an embodiment.

Each step of the method of manufacturing the OLED display panel according to the embodiment of the present disclosure will be described in detail below with reference to FIGS. 2 to 3f. FIG. 2 is a schematic structural diagram of an OLED display panel according to an embodiment of the present disclosure. FIGS. 3a-3h are schematic diagrams of a manufacturing process of the OLED display panel according to an embodiment of the present disclosure.

As shown in FIG. 2, an OLED display panel 200 according to an embodiment of the present disclosure includes: a backplane 1, a light emitting layer 2, an encapsulation layer 3, an organic layer 4, a black mask layer 5, a color film layer 6 and a planarization layer 7.

Figure 3A:
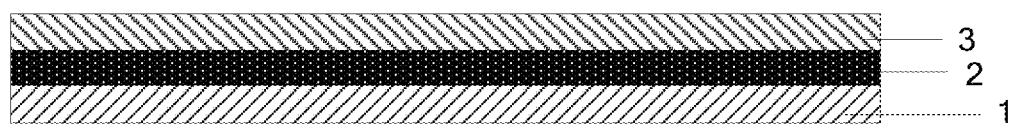
FIGS. 3*a*-3*h* are schematic diagrams of a manufacturing process of the OLED display panel according to an embodiment.

As shown in FIG. 3a, in the method of manufacturing an OLED display panel according to an embodiment of the present disclosure, first, a backplane 1 is provided, a light-emitting layer 2 is provided on one side of the backplane 1, and an encapsulation layer 3 is provided on a side of the light-emitting layer 2 away from the backplane (step 101). The light-emitting layer 2 may have a multi-layer structure. For example, the light-emitting layer 2 may include a cathode layer, one or more organic light-emitting layers, an anode layer and other structures. The encapsulation layer 3 may be formed of an insulating material.

Figure 3B:
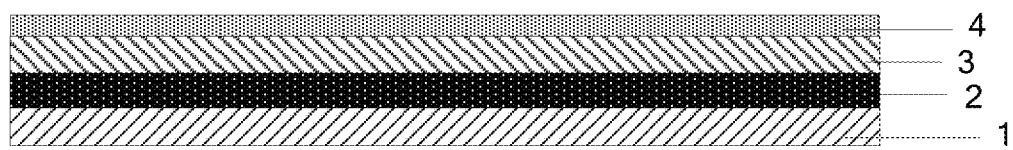
Figure 4:
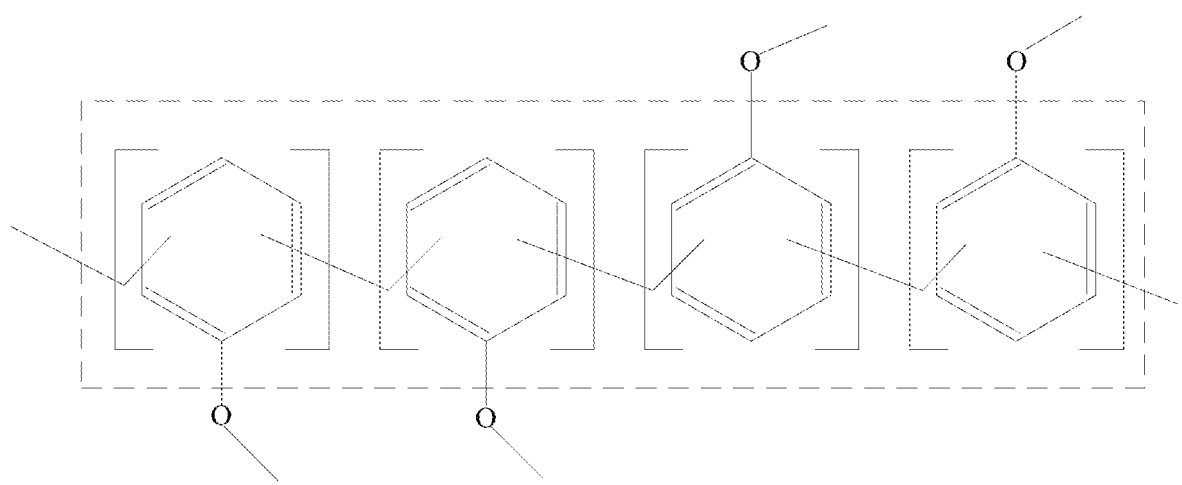
FIG. 4 is a schematic structural diagram of an organic layer material according to an embodiment of the present disclosure.

Then, as shown in FIG. 3b, an organic layer 4 is formed on a side of the encapsulation layer 3 away from the light-emitting layer using an organic material (step 102). In some embodiments according to the present disclosure, the organic material can be, for example, an organic material whose main chain (shown in the dashed frame) is a benzene ring molecular structure as shown in FIG. 4.

Figure 5:
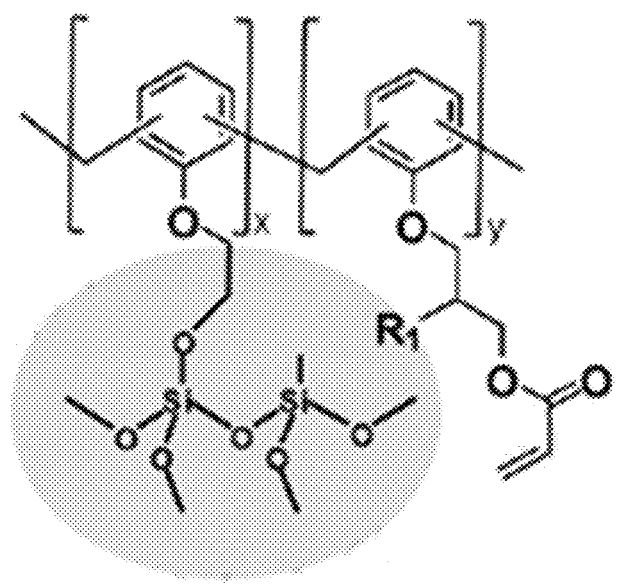
FIG. 5 is a schematic structural diagram of an organic layer material according to an embodiment of the present disclosure.

In another embodiment according to the present disclosure, the organic material may be a modified phenolic resin. For example, FIG. 5 shows a structural diagram of a modified phenolic resin according to an exemplary embodiment of the present disclosure, in which the modified phenolic resin has photocrosslinking groups. In some embodiments according to the present disclosure, the organic material may be a photoresist.

Figure 3C:
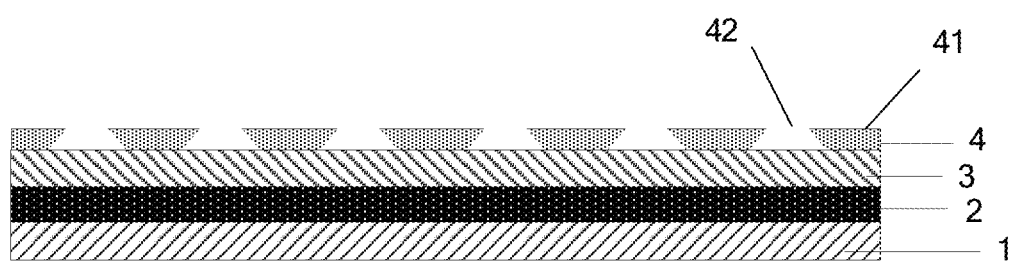

Next, as shown in FIG. 3c, the organic layer 4 is patterned to form a first region 41 covered by the organic layer 4 and a second region 42 not covered by the organic layer 4 on the encapsulation layer 3 (step 103). For example, in the case where the material of the organic layer 4 is a photoresist, the organic layer 4 can be patterned by conventional processing steps such as masking, exposing, developing, etc., so as to form the first region 41 and the second region 42. In the first region 41, the organic layer 4 over the encapsulation layer 3 is retained. In the second region 42, the organic layer 4 over the encapsulation layer 3 is removed.

Figure 3D:
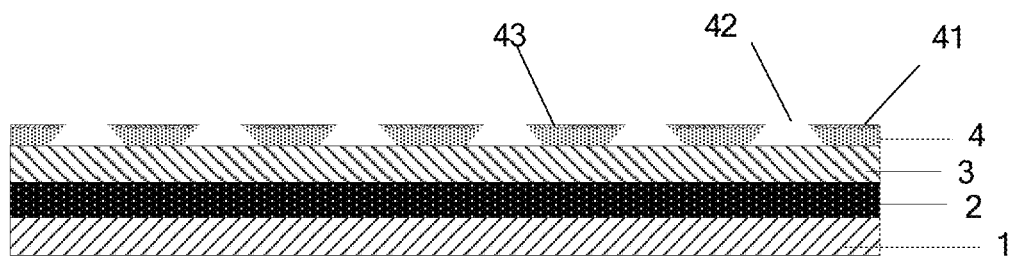

Then, as shown in FIG. 3d, the organic layer 4 is etched, and a plurality of pits 43 are formed on a surface of the organic layer 4 away from the encapsulation layer 3 (step 104). In some embodiments according to the present disclosure, the surface of the organic layer 4 may be etched by dry etching to form the pits 43. The organic layer 4 formed of an organic material according to the embodiment of the present disclosure described above is easily corroded by oxygen, so that the pits 43 can be formed on the organic layer 4. For example, if the organic material forming the organic layer 4 is an organic material with a benzene ring molecular structure or a modified phenolic resin, the organic layer 4 can be etched using oxygen as an etching gas. In the etching process, the flow rate of oxygen is in the range of 90 sccm to 170 sccm (standard cubic centimeters per minute), the pressure of the oxygen environment in the reaction chamber is 10 mmHg to 30 mmHg (millimeters of mercury), and the temperature is 70° C. to 90° C. (degrees Celsius), and the precessing time is 10 s to 20 s (seconds). Table 1 shows various examples and comparative examples of the etching process.

TABLE 1

| | Flow Rate (sccm) | Pressure (mmHg) | Temperature (° C.) | Time (s) | Absorbance | Transmittance |
|---|---|---|---|---|---|---|
| Comparative Example 1 | 60 | 15 | 60 | 15 | 0.12 | 74.87% |
| Comparative Example 2 | 0 | 20 | 80 | 15 | 0.013 | 94.76% |
| Example 1: | 90 | 30 | 90 | 10 | 0.70 | 30.49% |
| Example 2: | 100 | 28 | 88 | 12 | 0.79 | 26.17% |
| Example 3: | 110 | 26 | 85 | 14 | 0.88 | 20.39% |
| Example 4: | 120 | 23 | 82 | 16 | 0.95 | 15.28% |
| Example 5: | 130 | 20 | 80 | 17 | 0.97 | 13.72% |
| Example 6: | 150 | 15 | 75 | 19 | 0.99 | 10.32% |
| Example 7: | 170 | 10 | 70 | 20 | 0.99 | 8.46% |

Figure 3E:
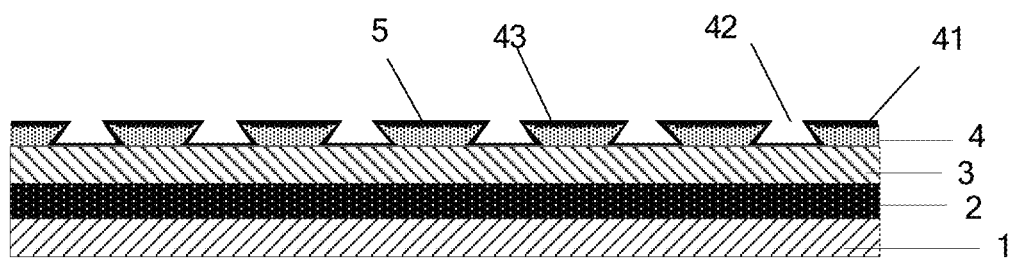
Figure 3F:
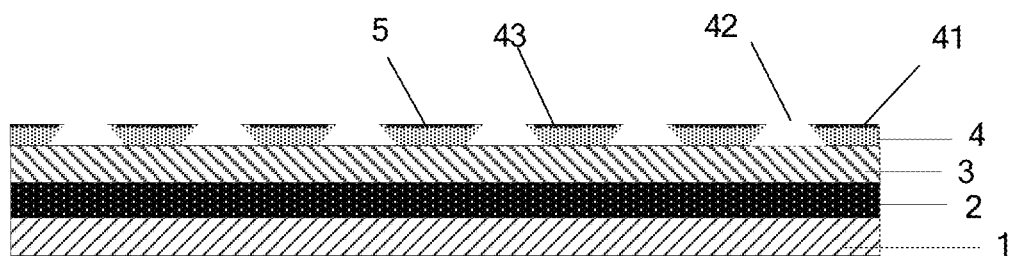

Next, as shown in FIG. 3e, the plurality of pits 43 are filled with a metal to form a black mask layer 5 (step 105).

For example, in the embodiment according to the present disclosure, a metal layer may be formed in the first region 41 and the second region 42 by means of atomic layer deposition (ALD) or radio frequency sputtering physical vapor deposition (RFPVD). The metal here can be selected from aluminum, molybdenum, copper or silver, and the like, for example. In addition, in some embodiments according to the present disclosure, the metal layer may be a multi-layer structure, for example, a Ti/Al/Ti structure or the like.

Then, the metal layer is etched to remove the metal layer in the second region 42 and the metal layer in the first region 41 covering the side of the organic layer 4 where the pits 43 are provided. Thus, as shown in FIG. 3f, only the metal in the pits 43 remains. The metal remaining in the pits 43 and the organic material of the organic layer 4 in the first region 41 together constitute the black mask layer 5.

Figure 6:
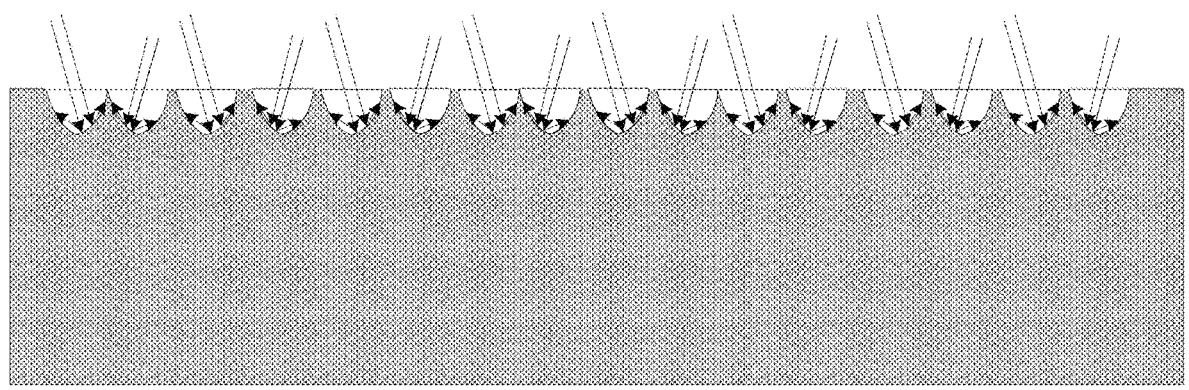
FIG. 6 is a schematic diagram showing the light absorption principle of the organic layer and the black mask layer according to an embodiment.

The inventors of the present disclosure have found that diffuse reflection can be achieved through the pits 43 formed on the organic layer 4 and the residual metal in the pits 43, which can effectively absorb light and reduce the reflectivity. As shown in FIG. 6, light entering a pit is continuously reflected and refracted in the pit, and finally absorbed, thereby achieving the effect of blocking the light and reducing the reflectivity.

As shown in Table 1 above, the absorbance (OD) of the black mask layer 5 prepared according to various embodiments of the present disclosure is above 0.70, and the transmittance (AVE) is less than 30.50%. Therefore, the black mask layer 5 can have the effect of light shielding.

In addition, in the present embodiment according to the present disclosure, through controlling parameters such as oxygen flow rate, pressure, temperature, reaction time, etc., etching performed on the surface of the organic layer 4 can be controlled. These parameters together determine the depth and range of the pits 43 on the surface of the organic layer 4, and the value of the oxygen flow rate has a great influence, among others. The depth, density and diameter of the pits 43 further affect the transmittance of the black mask layer 5. If the surface of the organic layer 4 is etched excessively, larger and deeper pits 43 obtained will affect the transmittance of the black mask layer 5. If the etching is insufficient, there are not enough pits 43 formed on the surface of the organic layer 4, and the resulted black mask layer 5 will not achieve the desired effect. Therefore, it is necessary to control parameters such as the flow rate of oxygen, etc., so that the pits 43 and the black mask layer 5 formed on the surface of the organic layer 4 can fully absorb light.

Figure 3G:
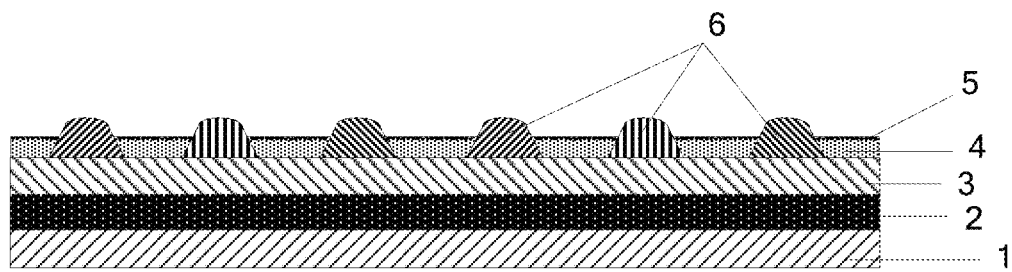

Next, as shown in FIG. 3g, a color film layer 6 is formed in the second region 42 (step 106). The color film layer 6 can filter the light emitted by the light-emitting layer 2 to obtain light of a desired color.

Figure 3H:
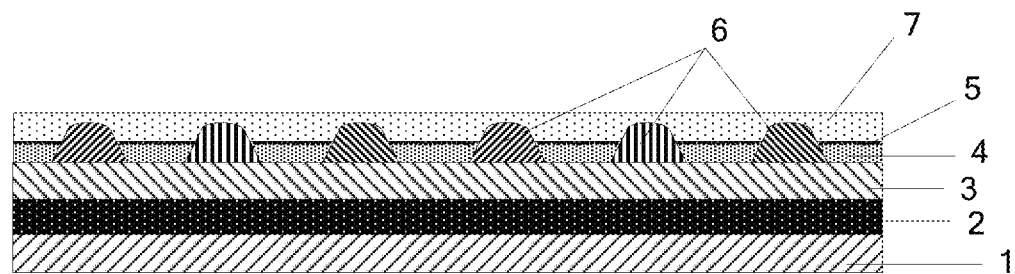

Finally, as shown in FIG. 3h, a planar layer 7 covering the color film layer 6 and the black mask layer 5 is formed on the color film layer 6. The planar layer 7 can protect the color film layer 6 and the black mask layer 5. For example, the planar layer 7 may be formed using an organic material, an inorganic material, or the like.

In the process of manufacturing an OLED display panel according to the embodiments of the present disclosure, it is not necessary to separately provide a black mask layer, which can effectively reduce the thickness of the film layers while saving costs.

According to the preparation method provided in the embodiment of the present disclosure, it is not necessary to provide a black mask layer between the color films, which can eliminate the process issues such as alignment, residue, etc., caused by the preparation of the black mask layer. Furthermore, without the use of corresponding light-shielding materials, a large amount of cost can be saved, and the thickness of the film layers can be effectively reduced; further, by forming a rugged (pits) structure on the organic layer and forming a black mask layer, light is continuously reflected and refracted in the pits, and finally absorbed, thereby reducing the light reflectivity.

An embodiment of the present disclosure further provides an OLED display panel, which is prepared by the above manufacturing method.

Figure 7:
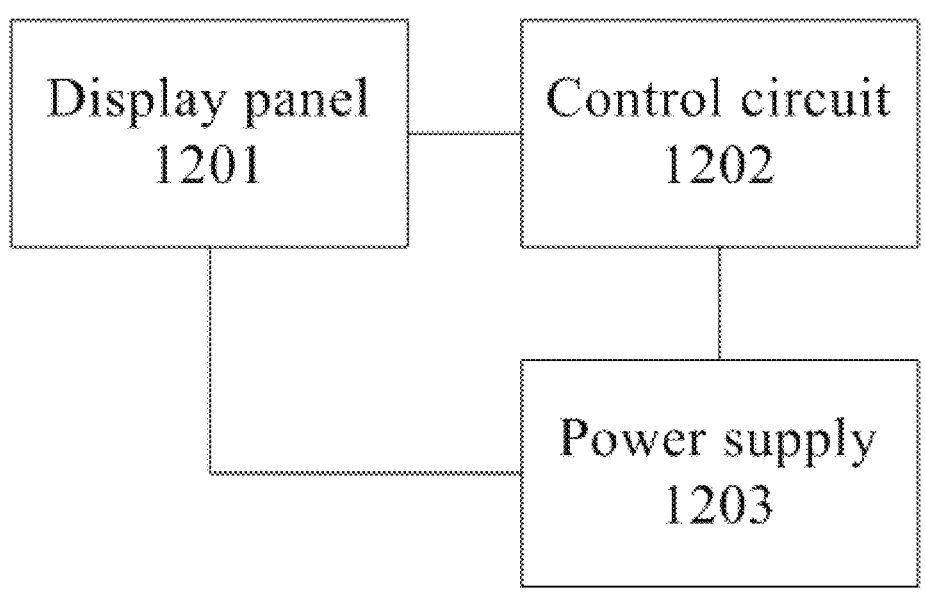
FIG. 7 is a structural diagram of an OLED display device according to an embodiment of the present disclosure.

According to an embodiment of the present disclosure, there is further provided an OLED display device. As shown in FIG. 7, the OLED display device 1200 includes an OLED display panel 1201, a control circuit 1202 and a power supply 1203. Wherein, the OLED display panel according to the present disclosure is adopted in the OLED display panel 1201, and the control circuit 1202 is configured to control the OLED display panel 1201. The power supply 1203 is configured to supply power to the OLED display panel 1201 and the control circuit 1202.

The above description only shows preferred embodiments of the present application and illustrates technical principles applied in the present application. Those skilled in the art should understand that the scope of the invention involved in this application is not limited to the technical solution formed by a specific combination of the above technical features, and should encompass other technical solutions formed by any combinations of the above technical features or their equivalent features without departing from the inventive concept of the present application, such as, a technical solution formed by replacing the above features with technical features with functions similar to those features (but not limited to these features) disclosed in this application.

What is claimed is:

1. A method of manufacturing an OLED display panel, comprising:
providing a backplane, wherein a light-emitting layer is provided on the backplane, and an encapsulation layer is provided on the light-emitting layer;
forming an organic layer on a side of the encapsulation layer away from the light-emitting layer using an organic material;
patterning the organic layer to form, on the encapsulation layer, a first region covered by the organic layer and a second region not covered by the organic layer;
etching the organic layer in the first region to form a plurality of pits on a surface of the organic layer away from the encapsulation layer;
filling the plurality of pits with a metal to form a black mask layer;
forming a color film layer in the second region;
and forming a planar layer covering the color film layer and the black mask layer.

2. The method of manufacturing an OLED display panel according to claim 1, wherein the material of the organic layer is an organic material whose main chain is a benzene ring molecular structure.

3. The method of manufacturing an OLED display panel according to claim 1, wherein the material of the organic layer is a modified phenolic resin.

4. The method of manufacturing an OLED display panel according to claim 1, wherein the etching is a dry etching process.

5. The method of manufacturing an OLED display panel according to claim 4, wherein a gas environment of the dry etching process is an oxygen environment.

6. The method of manufacturing an OLED display panel according to claim 5, wherein an oxygen flow rate of the dry etching process is 90 sccm to 170 sccm.

7. The method of manufacturing an OLED display panel according to claim 6, wherein an oxygen flow rate of the dry etching process is 150 sccm.

8. The method of manufacturing an OLED display panel according to claim 5, wherein the pressure of the oxygen environment is 10 mmHg to 30 mmHg.

9. The method of manufacturing an OLED display panel according to claim 5, wherein the temperature of the dry etching process is 70° C. to 90° C.

10. The method of manufacturing an OLED display panel according to claim 5, wherein the time of the dry etching process is 10 s to 20 s.

11. The method of manufacturing an OLED display panel according to claim 1, wherein filling the plurality of pits with a metal to form a black mask layer includes:
   forming a metal layer on the side with the pits on the organic layer,
   etching the metal layer to only remain the metal in the pits.

12. The method of manufacturing an OLED display panel according to claim 11, wherein the metal is selected from one of: titanium/aluminum/titanium, aluminum, molybdenum, copper and silver.

13. An OLED display panel manufactured by using the method of claim 1.

14. An OLED display device, including the OLED display panel of claim 1.

* * * * *